United States Patent
Yim

(10) Patent No.: US 6,175,943 B1
(45) Date of Patent: Jan. 16, 2001

(54) APPARATUS FOR CONTROLLING ADDRESSES OF SYMBOL DATA FOR ERROR CORRECTION

(75) Inventor: Jong-sang Yim, Suwon (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/207,608

(22) Filed: Dec. 9, 1998

(30) Foreign Application Priority Data

Dec. 17, 1997 (KR) .................................................. 97-69974

(51) Int. Cl.<sup>7</sup> ............................ G11C 29/00; H03M 13/03
(52) U.S. Cl. ........................ 714/769; 714/805; 714/795; 711/4
(58) Field of Search ..................................... 711/220, 200, 711/100, 105, 104, 111, 1, 4; 714/805, 763, 768, 769, 770, 771, 701, 702, 50, 51, 53, 798

(56) References Cited

U.S. PATENT DOCUMENTS

| | | | |
|---|---|---|---|
| 4,254,500 | * | 3/1981 | Brookhart ............................. 386/87 |
| 4,707,805 | * | 11/1987 | Narusawa et al. .................... 364/900 |
| 6,029,208 | * | 2/2000 | Kim ........................................ 710/4 |

FOREIGN PATENT DOCUMENTS

| | | | |
|---|---|---|---|
| 57-123578 | 8/1982 | (JP) | ................................ G11B/27/10 |
| 60-253065 | 12/1985 | (JP) | ................................ G11B/20/10 |
| 63-160066 | 7/1988 | (JP) | ................................ G11B/20/10 |
| 2-214070 | 8/1990 | (JP) | ................................ G11B/20/18 |
| 3-187070 | 8/1991 | (JP) | ................................ G11B/20/18 |

* cited by examiner

*Primary Examiner*—Trinh L. Tu
(74) *Attorney, Agent, or Firm*—Sughrue, Mion, Zinn, Macpeak & Seas, PLLC

(57) ABSTRACT

An apparatus for controlling addresses of symbol data obtained by demodulating a bit stream read from a disk for an error correction is provided. The apparatus for controlling the addresses of the symbol data includes, a sync detector for receiving the bit stream and detecting a frame sync and an ID sync, a frame sync number generator for receiving the frame sync, comparing the frame sync with a sync frame structure, correcting the frame sync, and generating information on the position of the frame sync, an ID error corrector for correcting the errors of the ID included in the symbol data and outputting the ID, an ID sync number detector for receiving the ID and a frame sync from the sync detector and detecting the information on the position of the ID, an address generator for receiving the information on the position of the frame and the information of the position of the ID, and generating the address of the symbol data corresponding to an ECC block, and a controller for controlling the detectors and the generators. It is possible to effectively perform the error correction by generating a memory address according to the sector and the frame set by the information of the position of each frame and information on the position of the ID with respect to the symbol data read from the disk of a DVD player and then demodulated and storing the symbol data in a memory precisely corresponding to the ECC block.

6 Claims, 3 Drawing Sheets

| | | |
|---|---|---|
| SY0 | 0001001001000100 0000000000010001 | 0001001000000100 0000000000010001 |
| SY1 | 0000010000000100 0000000000010001 | 0000010001000100 0000000000010001 |
| SY2 | 0001000000000100 0000000000010001 | 0001000001000100 0000000000010001 |
| SY3 | 0000100000000100 0000000000010001 | 0000100001000100 0000000000010001 |
| SY4 | 0010000000000100 0000000000010001 | 0010000001000100 0000000000010001 |
| SY5 | 0010001001000100 0000000000010001 | 0010001000000100 0000000000010001 |
| SY6 | 0010010010000100 0000000000010001 | 0010000010000100 0000000000010001 |
| SY7 | 0010010001000100 0000000000010001 | 0010010000000100 0000000000010001 |

APPARATUS FOR CONTROLLING ADDRESSES OF SYMBOL DATA FOR ERROR CORRECTION

BACKGROUND OF THE INVENTION

1. Field of the Invention

The present invention relates to an apparatus for controlling addresses of symbol data for correcting errors of digital data, and more particularly, to an apparatus for controlling addresses of symbol data for correcting errors in a digital versatile disc (DVD) system.

2. Description of the Related Art

In a DVD system, data recorded in a disk is read during reproduction and an error correction of a Reed-Solomon (RS) product code type is performed. At this time, the read data is aligned in a virtual two dimensional state. The error corrections are respectively performed in the directions of horizontal and vertical axes. Accordingly, a two dimensional error correction effect is obtained. FIG. 1 shows structures of a data sector 10 and of an error correcting code (ECC) block 12 for the error correction in the DVD system. The data recorded on a disk (not shown) is read by a series of one-bit data columns. A bit stream in units of 16 bits is demodulated in a symbol data pattern of eight bits in a demodulating circuit (not shown). The error corrections with respect to the symbol data are respectively performed in the horizontal and vertical directions in the virtually arranged ECC block 12.

The ECC block 12 of the symbol data for the error correction is formed of 172 bytes×12 rows×16 data sectors excluding a parity and is comprised of pure symbol data forming 172 bytes×192 rows including the 16 frame rows of the data sector. A data structure of 182 bytes×192 rows is formed by adding an inner parity (PI) of 10 bytes for the error correction of the symbol data. The entire data of 182 bytes×208 rows to which an outer parity PO of 16 bytes is added to each of 182 columns is modulated and is recorded on a disk.

Here, when the respective symbol data are $B_{i,j}$ (i=0 through 207, j=0 through 181), a surplus polynomial $R_j(X)$ comprising 172 columns including outer parity is shown in the following Equation (1).

$$Rj(X) = \sum_{i=192}^{207} B_{i,j} \cdot X^{207-i} = \{I_j(X) \cdot X^{16}\} \bmod \{G_{PO}(X)\} \quad (1)$$

wherein, $$I_j(X) = \sum_{j=0}^{191} B_{i,j} \cdot X^{143-i} \text{ and } G_{PO}(X) = \prod_{k=0}^{15} (X + \alpha^k)$$

Also, the surplus Polynomial $R_i(X)$ comprising the 208 rows including inner parity is shown in the following Equation (2).

$$R_i(X) = \sum_{j=172}^{181} 181 B_{i,j} \cdot X^{181-j} = \{I_i(X) \cdot X^{10}\} \bmod \{G_{PI}(X)\} \quad (2)$$

wherein, $$I_i(X) = \sum_{j=0}^{171} B_{i,j} \cdot X^{171-i}, G_{PI(X)} = \prod_{k=0}^{9} (X + \alpha^k),$$

and α represents a primitive root of a primitive polynomial. Here, the positions of the respective symbol data other than the values of the respective symbol data are included in the components to be error corrected. Namely, the symbol data demodulated from the bit stream read from the disk must be recorded on a virtual original position in the ECC block 12 of FIG. 1. Accordingly, it is possible to detect and correct the data having errors during the error correction. When the symbol data demodulated from the bit stream is recorded one byte later or one byte earlier, and thus not recorded on the row to be recorded, a large number of error are generated. Accordingly, the error correction is not possible.

In the DVD system, a data unit of 91 bytes shown in the sector 10 of FIG. 1 is defined as even and odd frames in order to process various data. The respective frames are divided by frame syncs. The structures of the frame syncs are shown in FIG. 3A. The respective frames are earlier, thus forming the sector 10 of FIG. 1. The ECC block 12 which is a basic unit of the error correction is comprised of the sectors. Accordingly, a proper error correction is performed.

Therefore, when the symbol data is stored for the error correction, an apparatus for controlling addresses is required by which it is possible to improve the efficiency of the error correction by storing the symbol data in the memory so that the positions of the respective symbol data precisely correspond to the alignment of the symbol data of the ECC block.

SUMMARY OF THE INVENTION

It is an object of the present invention to provide an apparatus for controlling addresses of symbol data for an error correction by which it is possible to perform the error correction in an optimal state although a slip occurs in a disk by storing demodulated symbol data in a memory, precisely corresponding to an ECC block using position information extracted from a bit stream read during the reproduction of the disk.

Accordingly, to achieve the above object, there is provided an apparatus for controlling addresses for storing symbol data obtained by demodulating a bit stream read from a disk in a memory for an error correction, comprising a sync detecting portion for receiving the bit stream and detecting a frame sync and an ID (identification) sync, a frame sync number generating portion for correcting the detected series of frame syncs and outputting information on the positions of the frame syncs, an ID error correcting portion for outputting an error corrected ID using an ID parity included in the symbol data, an ID sync number detecting portion for receiving the error corrected ID and the ID sync, sequentially comparing the ID sync with a sync frame structure, checking whether a correct ID sync is input, and outputting information on the position of the ID, an address generating portion for receiving the frame sync, the ID sync, and the information on the positions of the respective syncs, generating addresses of symbol data corresponding to a predetermined position of an ECC block, and outputting the addresses to the memory, and a controlling portion for controlling the respective detecting and generating portions.

Also, the sync detecting portion detects the received frame sync as a concerned frame sync when the received frame sync bit coincides with the frame sync by more than predetermined number of bits.

Also, the degree of a scope within which the sync detecting portion senses the sync frame is controlled by the controlling portion.

Also, the information on the positions of the frames are the numbers of the detected concerned sync frames and the numbers of the sync frames are sequentially set according to the positions corresponding to the frame syncs.

Also, the information on the position of the ID is the ID number of a concerned sector.

Also, the frame sync number generating portion compares the received frame syncs with the frame syncs to check whether the former coincides with the latter and corrects the frame syncs.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Hereinafter, the present invention will be described in detail with reference to the attached drawings.

Figure 2:
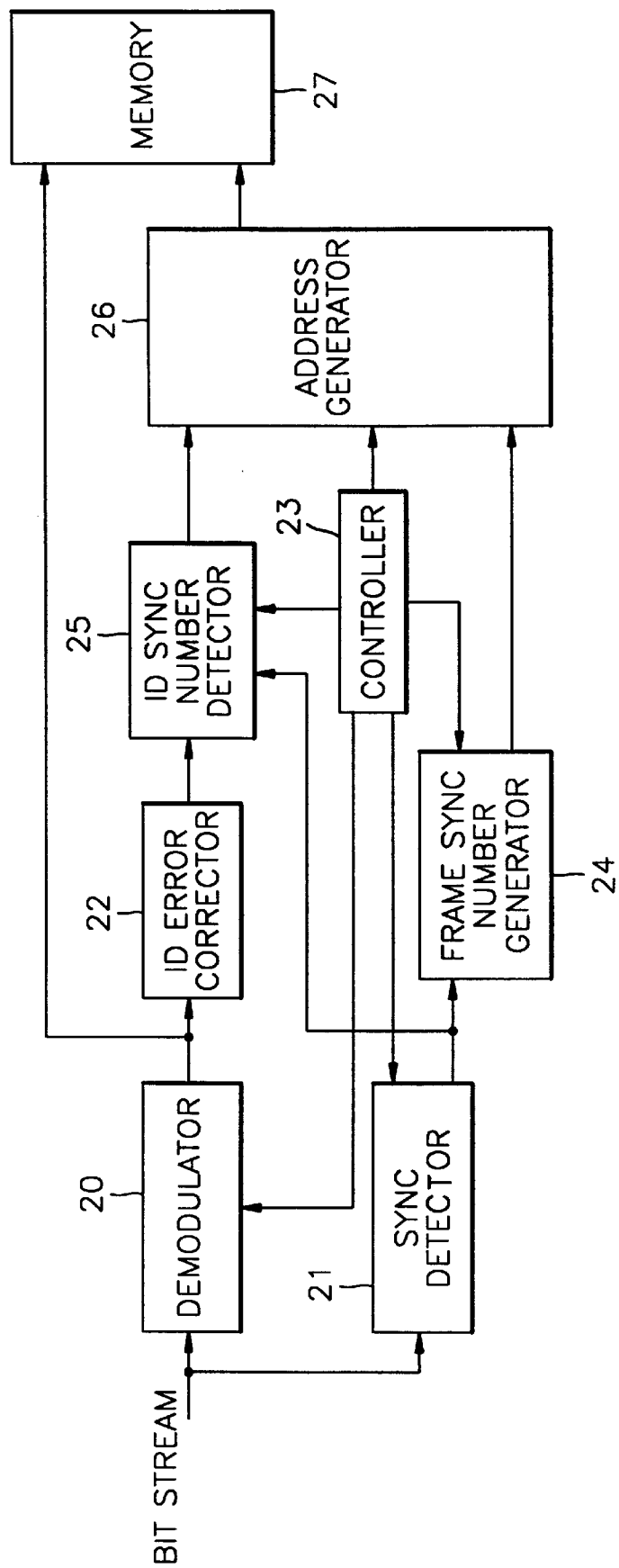
FIG. 2 is a block diagram for describing an apparatus for controlling addresses of symbol data for an error correction in a DVD system according to the present invention.

In FIG. 2, an apparatus for controlling the address of symbol data for an error correction according to the present invention is connected between a demodulator 20 for demodulating a bit stream in units of 16 bits read from a disk to symbol data in units of 8 bits through a 16/8 demodulation rule and a table in a DVD standard and a memory 27. The apparatus for controlling the addresses of the symbol data comprises a sync detector 21 receiving the bit stream and detecting an ID (identification) sync and a frame sync, an ID error corrector (ECC) 22 for correcting the errors of ID using an ID parity byte included in the symbol data, an ID sync number detector 25 for checking the continuity of the error corrected ID output from the ID ECC 22 in every sector, correcting the ID sync, and outputting the ID number, a frame sync number generator 24 for receiving the frame sync, checking whether the received frame sync has a continuity with a previous frame sync, and outputting a corrected frame sync and a frame number, an address generator 26 for receiving the ID number, the ID sync, the frame sync, and the frame number output from the ID sync number detector 25 and the frame sync number generator 24 and generating the addresses of the symbol data, a controller 23 for controlling the demodulator 20, and the respective generators and defectors, the memory 27 stores the symbol data so as to correspond to the position of data in the ECC according to the memory address generated by the address generator 26.

Figure 1:
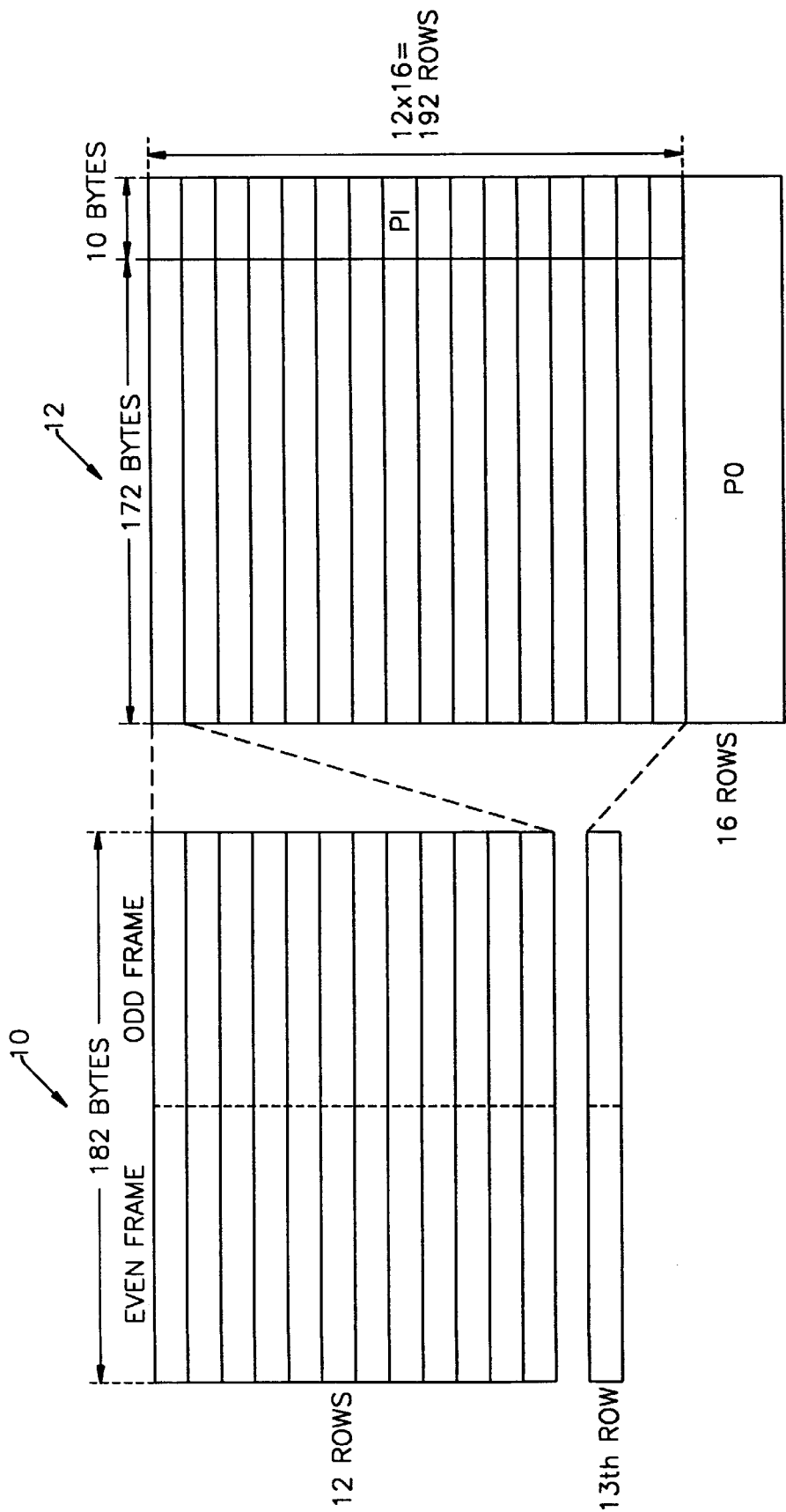
FIG. 1 shows the structures of a sector and an ECC block of data for a error correction in a DVD system.
Figures 3A, 3B:
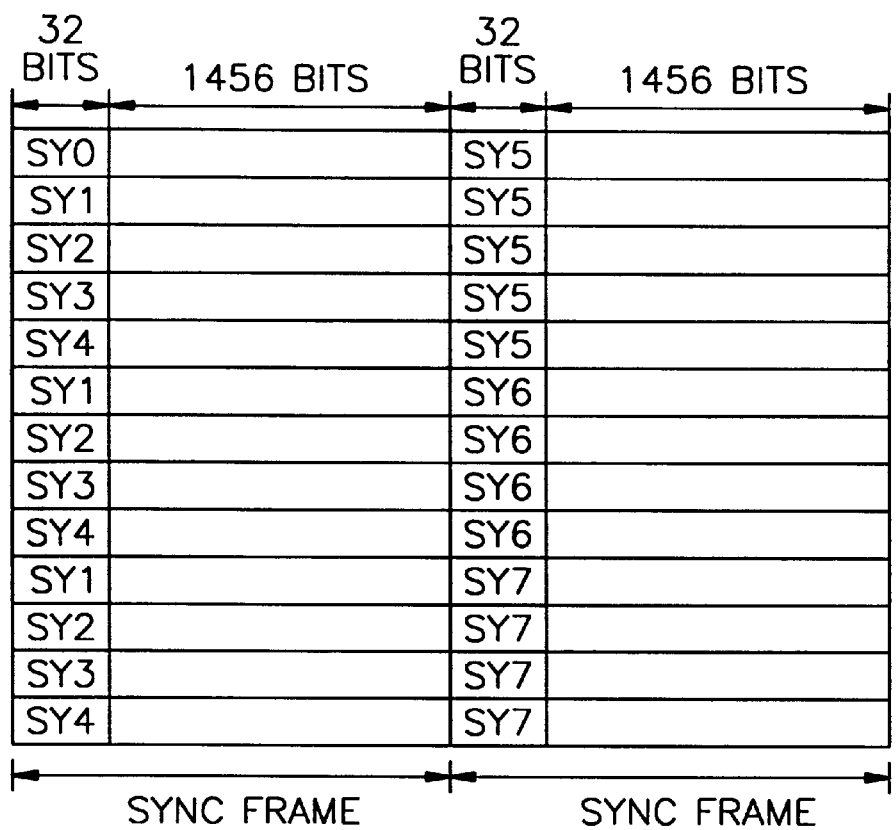
FIGS. 3A and 3B show the structure of a sync frame and a frame sync.

The sync frame is comprised of the respective frame syncs included in the bit stream read from a disk (not shown) and data which is not modulated as shown in FIG. 3A. The respective frame syncs SY0 through SY7 are each comprised of 32 bits. A section subsequent to each frame sync is comprised of data of 1456 bits and becomes data of 91 bytes after performing demodulation. FIG. 3B shows the values of two kinds of data which each 32-bit frame sync according to the DVD standard has. The frame syncs SY0 through SY7 which is the sync data of 32 bits are included in the bit stream data read from the disk and provides the sync information. One sector 10 comprised of frames is formed as shown in FIG. 1 when the sync frame shown in FIG. 3A is demodulated and arranged in frames.

Referring to the operation of the apparatus shown in FIG. 2, when the bit stream read from a disk (not shown) is input to the demodulator 20, the demodulator 20 demodulates a bit stream in units of 16 bits read by the 16/8 demodulating rule and the demodulating table according to the DVD standard to the symbol data in units of eight bits and outputs the symbol data. The sync detector 21 receives the bit stream and detects a frame sync included in the bit stream. Here, when the bits of the frame sync included in the bit stream coincide with the bits of one frame sync among the 8 frame syncs formed of 32 bits shown in FIG. 3B, the concerned frame sync is detected and output. The sync detector 21 can sense the concerned frame sync though the bits of the frame sync selected among the 8 frame syncs are different from the bits of the concerned frame sync by one bit or two bits. The degree of the sensing scope is controlled by the controller 23.

The frame sync number generator 24 receives series of frame syncs detected by the sync detector 21, predicts more precise sync information, sets a frame number so that the orders of the corrected frame sync and the respective frames can be recognized. Namely, according to the sync frame structure of the DVD standard shown in FIG. 3A, the SY0, SY5, and SY1 syncs are sequentially input to the frame sync number generator 24. Therefore, the frame sync number generator 24 predict the input of the SY5 sync after the SY1 sync and the input of the SY2 sync after the SY6 or SY7 sync and checks whether the frame syncs are input coinciding with the structure of the sync frame of FIG. 3A.

Here, when another frame sync other than the SY3 sync is input after the frame syncs SY0, SY5, SY1, SY5, SY2, and SY5 have been sequentially input, the input frame sync is sensed as the SY3 sync and is output. When the frame syncs are successively input, while not coinciding with the sync frame structure shown in FIG. 3B, the continuity is ignored. The number corresponding to the detected frame sync is generated and output. At this time, the number of checking the continuity of the frame or whether or not to check the continuity are performed under the control of the controller 23.

The ID ECC 22 outputs the ID whose errors are corrected using the ID parity byte of two bytes included in every sector comprised of the symbol data to the ID sync number detector 25. The ID sync output from the sync detector 21 simply denotes the beginning of the concerned sector and does not have information on the position on the ECC block. In the DVD standard, the four-byte ID of first symbol data of the sector denotes the value of the concerned sector. Less significant four bits among the four bytes denote the position of the sector in the same ECC block.

The ID sync number detector 25 sequentially compares the frame syncs SY0 through SY7 detected by the sync detector 21 in order to find the position of the concerned sector in the ECC block with the sync frame structure and detects the SY0 sync which is the ID sync. Namely, when the SY7 sync is input immediately before the sequentially input SY0 sync as in the sync frame structure, the input SY0 sync is considered as the ID sync. Also, the ID sync number detector 25 receives the error corrected ID and the ID sync from the sync detector 21 and detects the ID number showing the position of the concerned sector in the ECC block.

The address generator 26 receives the demodulated symbol data and the frame sync and the frame number output from the frame sync number generator 24 and the ID number and the ID sync output from the ID sync number detector 25 under the control of the controller 23 and generates addresses so that the symbol data is recorded on the memory 27 corresponding to the virtual position of the data in the ECC block 12 of FIG. 1 according to the standards of each sector and frame.

Therefore, it is possible to precisely record the read symbol data in the virtual position of the ECC block though the sector is repeatedly read due to the occurrence of slip or other various reasons when the bit stream is read from the disk, using the position information of the symbol data.

According to the present invention, it is possible to perform the error correction in an optimal state by storing the symbol data in a memory precisely corresponding to the ECC block according to the memory address generated using information on the position of each frame and information on each ID position with respect to the demodulated symbol data though the sector is repeatedly read from the disk due to the occurrence of the slip or other various reasons.

What is claimed is:

1. An apparatus for controlling addresses for storing symbol data for error correction in a memory, wherein the symbol data is obtained by demodulating a bit stream read from a disk, comprising:

a sync detecting portion for receiving the bit stream and detecting a frame sync and an identification (ID) sync included in the bit stream;

a frame sync number generating portion for receiving and correcting a series of frame syncs detected by the sync detecting portion and generating information indicating the positions of the frame syncs;

an ID error correcting portion for receiving the symbol data, correcting an error in an ID sync using ID parity data included in the symbol data, and outputting the ID sync in which the error is corrected;

an ID sync number detecting portion for receiving the ID sync from the ID error correcting portion and the ID sync from the sync detecting portion, sequentially comparing the ID received sync with a sync frame structure, checking whether the received ID sync is corrected, and generating information indicating the position of the ID sync;

an address generating portion for receiving the frame syncs and the information indicating the positions of the frame syncs from the frame sync number generating portion, and the ID sync and the information indicating the position of the ID from the ID sync number generating portion, generating addresses of symbol data corresponding to a predetermined position of an error correcting code (ECC) block, and outputting the addresses to the memory; and a controller for controlling the sync detecting portion, the frame sync number generating portion, the ID sync correcting portion, the ID sync number detecting portion, and the address generating portion.

2. The apparatus of claim 1, wherein the sync detecting portion determines that a frame sync received in the bit stream is a detected frame sync when bits of the received frame sync match the bits of a known frame sync pattern by more than a predetermined number of bits.

3. The apparatus of claim 2, wherein the detection of the sync frame by the sync detecting portion is controlled by the controlling portion.

4. The apparatus of claim 1, wherein the information indicating the positions of the frame syncs are numbers of sync frames and the numbers of the sync frames are sequentially set according to the positions corresponding to the frame syncs.

5. The apparatus of claim 1, wherein the information on the position of the ID is the ID number of a data sector.

6. The apparatus of claim 1, wherein the frame sync number generating portion compares the frame syncs received from the sync detecting portion with frame syncs of known sync frames to check whether the received frame syncs coincide with the frame syncs of the known sync frames and corrects the frame syncs received from the sync detecting portion.

* * * * *